US011025464B1

(12) United States Patent
Chen et al.

(10) Patent No.: US 11,025,464 B1
(45) Date of Patent: Jun. 1, 2021

(54) PASSIVE INTERMODULATION REDUCTION WITH FREQUENCY SHIFTING

(71) Applicant: Analog Devices International Unlimited Company, Limerick (IE)

(72) Inventors: Dong Chen, Beijing (CN); Yong Zhang, Beijing (CN); Francis T. Kearney, Croom (IE); Xiuhong Lu, Beijing (CN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/890,265

(22) Filed: Jun. 2, 2020

(30) Foreign Application Priority Data

May 9, 2020 (WO) ................ PCT/CN2020/089369

(51) Int. Cl.
| | | |
|---|---|---|
| *H04B 1/10* | (2006.01) |
| *H04L 5/14* | (2006.01) |
| *H04B 1/00* | (2006.01) |
| *H04L 25/02* | (2006.01) |
| *H04L 25/03* | (2006.01) |
| *H04B 17/00* | (2015.01) |
| *H04L 27/22* | (2006.01) |
| *H04B 1/04* | (2006.01) |
| *H04L 27/00* | (2006.01) |

(52) U.S. Cl.
CPC ............... *H04L 27/22* (2013.01); *H04B 1/04* (2013.01); *H04L 25/02* (2013.01); *H04L 27/00* (2013.01)

(58) Field of Classification Search
None
See application file for complete search history.

(56) References Cited

U.S. PATENT DOCUMENTS

| 8,855,175 B2 | 10/2014 | Wyville et al. |
| 8,971,834 B2 | 3/2015 | Keehr et al. |
| 9,026,064 B2 * | 5/2015 | Wang ..................... H04B 1/123 455/79 |

(Continued)

FOREIGN PATENT DOCUMENTS

WO 2017147759 A1 9/2017

OTHER PUBLICATIONS

Chen, *Passive Inter-modulation Cancellation in FDD System*, Master's Thesis, Lund University, Mar. 2017, 55 pages.

(Continued)

*Primary Examiner* — Pablo N Tran
(74) *Attorney, Agent, or Firm* — Patent Capital Group

(57) ABSTRACT

A system for reducing or eliminating PIM interference in an RX signal is disclosed. The system is configured to use RX and TX signals to generate a frequency-shifted output that includes a RX carrier signal component of the RX signal, as well as first and second TX carrier signal components of the TX signal, positioned in a frequency spectrum so that a frequency spacing between the first and the second TX carrier signal components and a frequency spacing between the RX carrier signal component and a closest one of the first and the TX second carrier signal components is smaller than a frequency spacing between the first and the second TX carrier signal components in the TX signal. The system may then use the frequency-shifted output to generate an estimate of a PIM signal component in the RX signal.

20 Claims, 8 Drawing Sheets

(56) References Cited

U.S. PATENT DOCUMENTS

| | | | |
|---|---|---|---|
| 9,036,486 B2 | 5/2015 | Maca et al. | |
| 9,455,792 B1* | 9/2016 | Truesdale | H04B 17/11 |
| 9,621,220 B2* | 4/2017 | Tobisu | H04B 1/0475 |
| 9,693,364 B2* | 6/2017 | Gale | H04B 1/525 |
| 9,768,812 B1 | 9/2017 | Tsui et al. | |
| 10,237,765 B1* | 3/2019 | Bradley | H04B 17/0085 |
| 10,305,524 B2* | 5/2019 | Zou | H04B 1/525 |
| 10,345,438 B2* | 7/2019 | Gander | G01S 11/023 |
| 10,651,885 B2* | 5/2020 | Lai | H04B 1/123 |
| 2014/0036969 A1* | 2/2014 | Wyville | H04B 1/38 |
| | | | 375/219 |
| 2016/0352369 A1 | 12/2016 | Smith | |
| 2017/0141807 A1 | 5/2017 | Chen et al. | |
| 2017/0141938 A1 | 5/2017 | Chen et al. | |
| 2017/0201277 A1 | 7/2017 | Wang et al. | |
| 2018/0248572 A1* | 8/2018 | Ishikawa | H04B 1/0475 |
| 2020/0274629 A1* | 8/2020 | Wilson | H04B 7/0413 |

OTHER PUBLICATIONS

Kearney et al., *Passive Intermodulation (PIM) Effects in Base Stations: Understanding the Challenges and Solutions,* Analog Dialogue 51-03, Mar. 2017, 5 pages.

Harris, *What's Up with Digital Downconverters—Part 1,* Analog Dialogue 50-07, Jul. 2016, 7 pages.

Introduction to PIM, Passive Intemodulation (PIM)—Anritsu America, Apr. 22, 2020, 17 pages.

* cited by examiner

US 11,025,464 B1

PASSIVE INTERMODULATION REDUCTION WITH FREQUENCY SHIFTING

CROSS REFERENCE TO RELATED APPLICATIONS

This application is related to PCT Application No. PCT/CN2020/089369, filed May 9, 2020, entitled "PASSIVE INTERMODULATION REDUCTION WITH FREQUENCY SHIFTING," the disclosure of which is hereby incorporated by reference herein in its entirety.

TECHNICAL FIELD OF THE DISCLOSURE

The present disclosure generally relates to electronics, and, more specifically, to reducing nonlinear effects due to passive intermodulation.

BACKGROUND

Radio systems are systems that transmit and receive signals in the form of electromagnetic waves in the radio frequency (RF) range of approximately 3 kilohertz (kHz) to 300 gigaHertz (GHz). Radio systems are commonly used for wireless communications, with cellular/wireless mobile technology (e.g., Long Term Evolution (LTE) and $5^{th}$ generation (5G) systems) being a prominent example. Linearity of various components of such systems plays a crucial role.

Linearity of an RF component or system is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency.

Made from semiconductor materials, which are inherently nonlinear, and having to operate at relatively high-power levels, active components such as power amplifiers are usually the first to be analyzed when considering a design of an RF system in terms of linearity. Power amplifier outputs with nonlinear distortions can result in reduced modulation accuracy and/or out-of-band emissions. Therefore, wireless communication systems have stringent specifications on power amplifier linearity and various techniques (e.g., digital predistortion) have been developed to improve the performance of power amplifiers and other active devices during both the design and operational phases.

It is easy to forget that passive devices used in RF systems, e.g., loose cable connections, aged antennas, suboptimal duplexers, or dirty connectors, can also introduce nonlinear effects. Although sometimes relatively small, if not corrected, these nonlinearities can have serious effects on system performance. Passive intermodulation (PIM) is one example of a nonlinear effect caused by nonlinearity of passive devices. A variety of factors can affect the cost, quality and robustness of a PIM reduction solution included in an RF system. Physical limitations such as space/surface area, as well as limitations that may be imposed by regulations, can pose further constraints to the requirements or specifications of PIM reduction circuits. Thus, trade-off and ingenuity must be exercised in designing a PIM reduction solution for RF applications.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
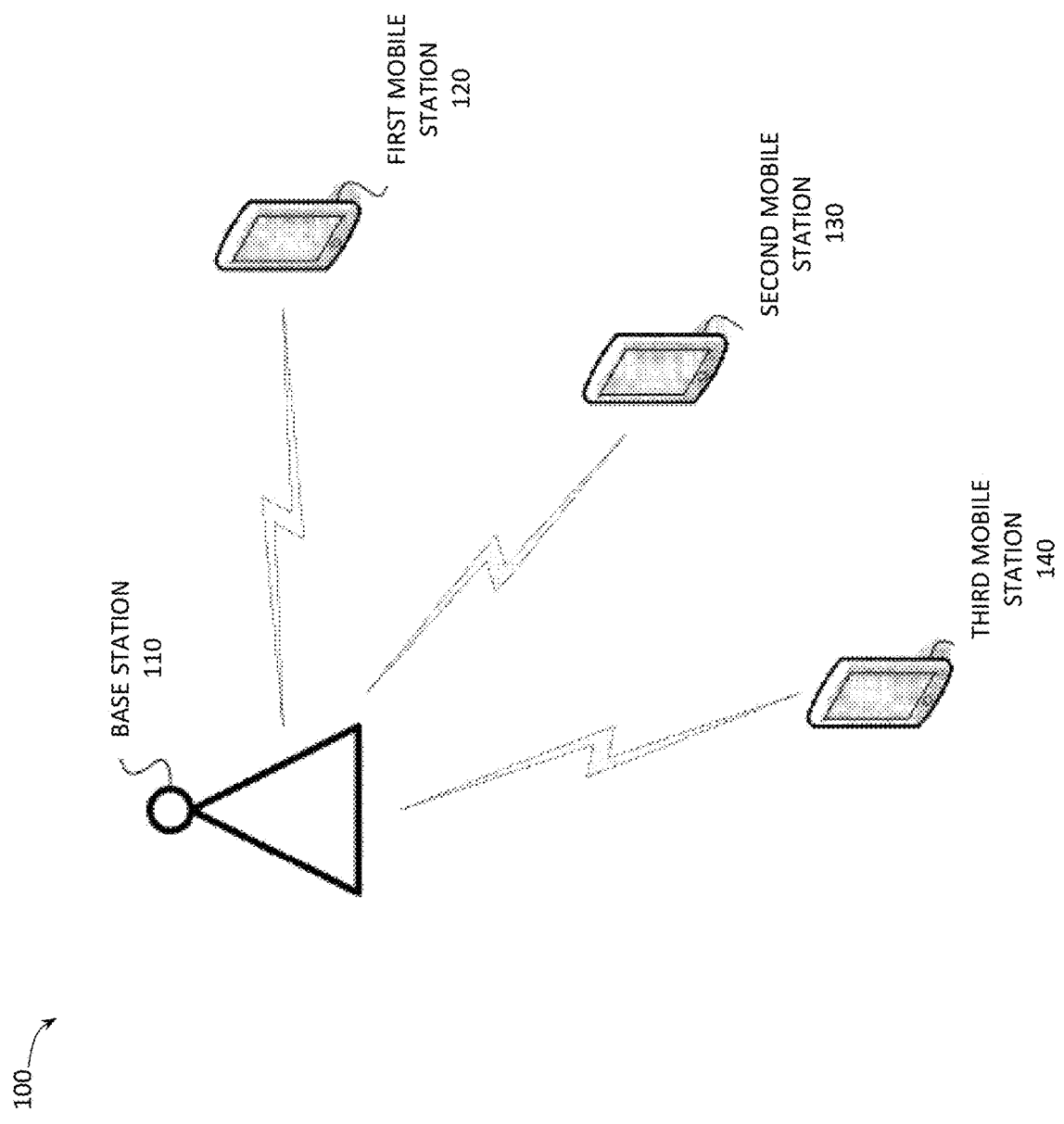
FIG. 1 illustrates a wireless communication system in which PIM reduction using frequency shifting may be implemented, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating PIM reduction with frequency shifting proposed herein, it might be useful to first understand phenomena that may come into play in communication systems. The following foundational information may be viewed as a basis from which the present disclosure may be properly explained. Such information is offered for purposes of explanation only and, accordingly, should not be construed in any way to limit the broad scope of the present disclosure and its potential applications.

PIM is a result of having nonlinear passive devices in a signal chain. PIM arises when two or more RF signals are inadvertently mixed as they transit through a passive device with nonlinear properties. In context of the cellular industry, two or more transmitted (TX) carrier signals can mix together and the intermodulation product of this mixing, which may be referred to as a "PIM signal component," could happen to fall into the frequency band of the receiver, thereby reducing receiver's sensitivity, causing performance degradation of the received (RX) signal, or even inhibiting communication altogether. This resultant interference can affect the cell that caused the PIM, as well as other nearby receivers. For example, in LTE Frequency Band 2, the downlink frequency range is specified to be from 1930 megahertz (MHz) to 1990 MHz, while the uplink ranges from 1850 MHz to 1910 MHz. If two TX carrier signals having frequencies of 1940 MHz and 1980 MHz are transmitting from a base station system with PIM, their intermodulation may lead to a PIM signal component at 1900 MHz, which will fall into the receiver band and will affect the receiver. Furthermore, their intermodulation may also produce a PIM signal component at 2020 MHz, which may affect other systems.

As the frequency spectrum becomes more crowded with allocated frequency ranges and antenna sharing schemes become more common, there is a corresponding increase in the possibility of PIM generation from the intermodulation of different carrier signals. The traditional way of using frequency planning to avoid PIM becomes almost impossible. Coupled with these challenges, the adoption of new digital modulation schemes means that the peak power of the communication systems also increases, adding to the severity of the PIM issue to the point where it may no longer be ignored. The problem is particularly acute for base stations, where typically several network systems share the same infrastructure and tightly spaced carrier signals could be sharing a single antenna so that different transmitted signals can transit through the same nonlinear passive device (s).

Since the nonlinearity of passive devices varies with temperature, humidity, mechanical stability, and device aging, PIM is intrinsically a time-dependent phenomenon. Therefore, PIM reduction typically involves using an adaptive model of how PIM may affect an RX signal. The model defines coefficients of a filter to be applied to the RX signal, in the digital domain, in an attempt to reduce and/or cancel distortions of the RX signal caused by PIM. In this manner, a PIM reduction circuit will try to compensate for various passive devices contributing to the undesirable nonlinear modification to the TX signal by applying a corresponding modification to the RX signal. The model is adaptive, which means that it is formed in an iterative process by repeatedly running an algorithm that gradually adjusts the filter coefficients based on the comparison between the signal to be transmitted and the signal that has been received. Running the algorithm for estimating the PIM filter coefficients increases power consumption and introduces additional design complexity to the final product.

Inventors of the present disclosure realized that conventional PIM reduction algorithms leave room for improvement in terms of power consumption and design complexity due to running the algorithm for estimating the PIM filter coefficients. In particular, when spacing between carrier signal components of a TX signal is $\Delta Fc$ (which spacing may, e.g., be defined as center-to-center frequencies of two adjacent carrier signals), the algorithm for estimating the PIM filter coefficients has to be run at a sampling rate higher than $2*\Delta Fc$ in order to avoid aliasing. Inventors of the present disclosure realized that the rate at which the algorithm for estimating the PIM filter coefficients is run may be reduced by performing frequency shifting of some signal components before running the algorithm. To that end, one aspect of the present disclosure provides an example system (or an apparatus) for reducing PIM interference in the RX signal. The RX signal includes an RX carrier signal component and may include a PIM signal component. The TX signal includes at least a first and a second TX carrier signal components with a certain frequency spacing between them. The system is configured to use the RX signal and the TX signal to generate a frequency-shifted output that includes the RX carrier signal component, the first TX carrier signal component, and the second TX carrier signal component positioned/aligned in a frequency spectrum so that a frequency spacing between the first and the second TX carrier signal components and a frequency spacing between the RX carrier signal component and a closest one of the first and the TX second carrier signal components is smaller than a frequency spacing between the first and the second TX carrier signal components in the TX signal. This means that at least one of the first and second TX carrier signal components is frequency-shifted, compared to the TX signal, which is the reason why this PIM reduction approach is referred to herein as "PIM reduction with frequency shifting." For example, if the frequency spacing between the first and the second TX carrier signal components in the TX signal was $\Delta Fc$, then the frequency spacing between these components in the frequency-shifted output, as well as the frequency spacing between the RX carrier signal component and the closest one of the first and second TX carrier signal components, is $\Delta F'c$, which is smaller than $\Delta Fc$. The system may then use the frequency-shifted output to generate an estimate of a PIM signal component to be applied to the RX signal to generate an RX signal with reduced PIM components. The algorithm for estimating the PIM filter coefficients has to be run at a rate that is only higher than $2*\Delta F'c$, in order to avoid aliasing, which rate may, be lower than $2*\Delta Fc$. Thus, performing frequency shifting as described herein allows reducing the minimum requirement for the rate at which the algorithm for estimating the PIM filter coefficients has to be run, from $2*\Delta Fc$ to $2*\Delta F'c$. Reducing the rate of the algorithm may advantageously allow reducing power consumption and/or design complexity.

As will be appreciated by one skilled in the art, aspects of the present disclosure, in particular aspects of PIM reduction with frequency shifting as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g., one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing RF transmitters, receivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection (e.g., an indirect electrical connection) through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a PIM reduction circuit may be referred to simply as a "PIM reduction," etc.). If used, the terms "substantially," "approximately," "about," etc., may be used to generally refer to being within +/−20% of a target value, e.g., within +/−10% of a target value, based on the context of a particular value as described herein or as known in the art.

Example Wireless Communication System

FIG. 1 illustrates a wireless communication system 100 in which PIM reduction using frequency shifting may be implemented, according to some embodiments of the present disclosure. The wireless communication system 100 may include a base station 110 and a plurality of mobile stations, examples of which are shown in FIG. 1 as a first mobile station 120, a second mobile station 130, and a third mobile station 140. The base station 110 may be coupled to a backend network (not shown) of the wireless communication system and may provide communication between the mobile stations 120, 130, and 140 and the backend network. In various embodiments, the wireless communication system 100 may include a plurality of base stations similar to the base station 110, which base stations may, e.g., be arranged in cells, where only one base station 110 is shown in FIG. 1 for simplicity and illustration purposes.

In some embodiments, the wireless communication system 100 may support multiple standards and multiple band communication. For example, the wireless communication system 100 may support LTE, Wideband Code Division Multiple Access (WCDMA), and Global System for Mobile Communication (GSM) standard communication. Each of the mobile stations 120-140 may support any one or more of these standards. However, the use of these listed standards is merely exemplary and other standards also may be supported by different parts of the wireless communication system 100. In addition to multiple standard capabilities, the wireless communication system 100 may also support multiple communication bands. For example, the wireless communication system 100 may support DCS/PCS bands and GSM850/GSM900 bands of GSM, N2/N3 bands of 5G New Radio (NR), or any other frequency bands of these or other radio access technologies and standards.

The base station 110 may support wireless communication with mobile stations 120-140 of various standard technologies as well as in multiple bands. The base station 110 may transmit signals to the mobile stations 120, 130, and 140 in downlink signals and receive signals from the mobile stations 120-140 in uplink signals. For example, the base station 110 may receive LTE compliant signals from the first mobile station 120, WCDMA signals from the second mobile station 130, and GSM signals from the third mobile station 140.

Cellular systems are deployed in many frequency bands that are defined by a combination of standardization organizations such as the 3d Generation Partnership Project (3GPP) and government-sponsored agencies such as the Federal Communications Commission (FCC). There are both frequency division duplex (FDD) and time division duplex (TDD) variants of frequency allocations that are used in commercial cellular networks. In FDD systems, the uplink and downlink use separate frequency bands at the same time while, in TDD systems, the uplink and downlink use the same frequencies at different times. The challenges related to PIM are particularly pronounced for FDD systems. In some embodiments, the wireless communication system 100 may be an FDD system, where any of the systems configured to implement PIM reduction using frequency shifting, described herein, may be deployed in the base station 110. In some embodiments, any of the systems configured to implement PIM reduction using frequency shifting, described herein, may be deployed in any of the mobile stations 120, 130, and 140.

Conventional PIM Reduction

As summarized above, embodiments of the present disclosure relate to PIM reduction. To that end, conventionally, a system as shown in FIG. 2 has been used.

Figure 2:
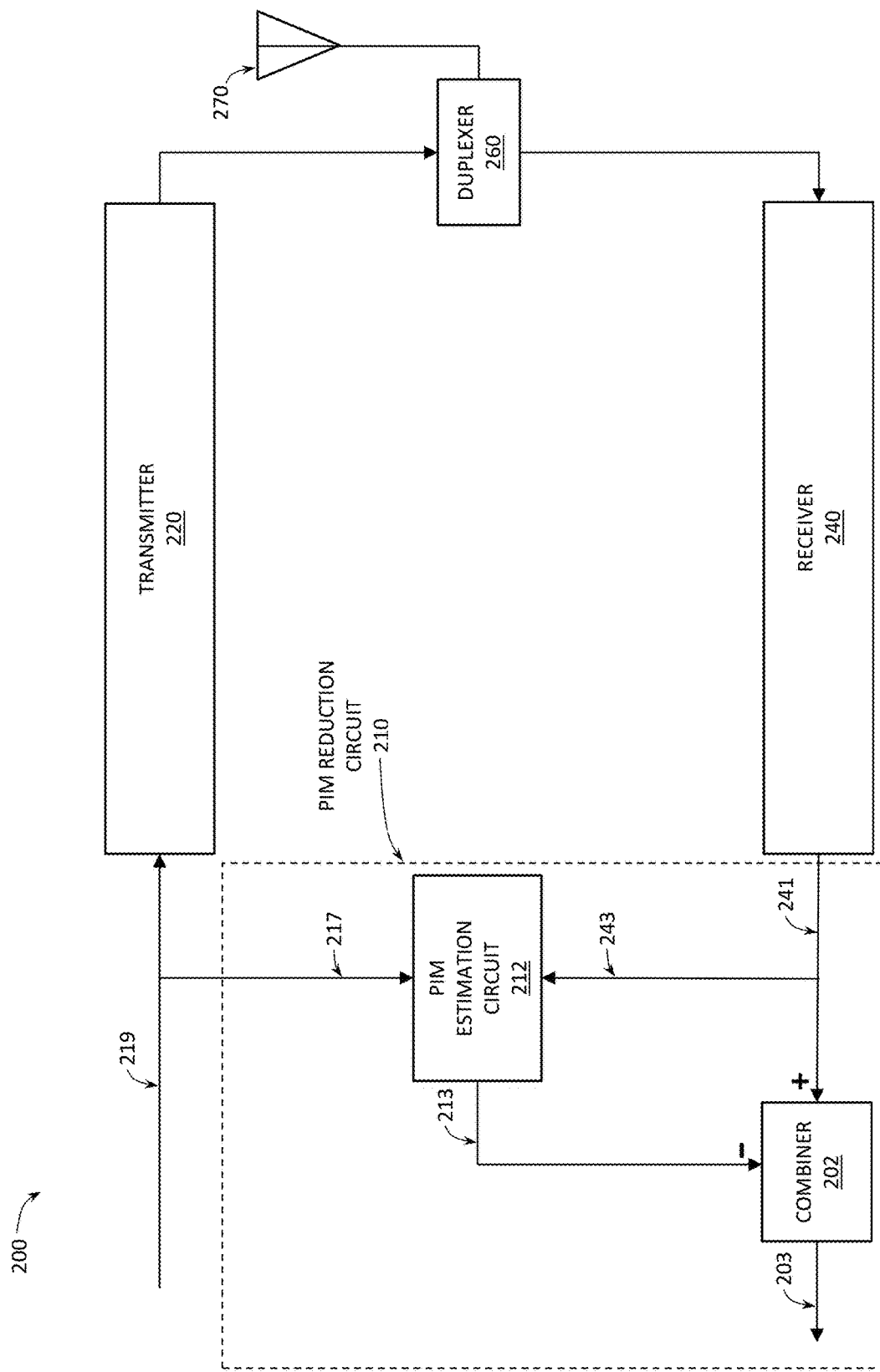
FIG. 2 illustrates a schematic block diagram of a communication system that employs a conventional PIM reduction circuit.

FIG. 2 illustrates a schematic block diagram of a communication system (e.g., a transceiver) 200 that employs a conventional PIM reduction circuit 210. FIG. 2 illustrates that the communication system 200 may include a transmitter circuit (or, simply, a "transmitter") 220 and a receiver circuit (or, simply, a "receiver") 240 in communication with the PIM reduction circuit 210. The system may further include a duplexer 260 and an antenna 270.

As shown in FIG. 2, the transmitter 220 may be configured to receive a TX signal 219 as an input, and provide a TX signal 221 as an output, while the receiver 241 may be configured to receive a RX signal 261 as an input, and provide a RX signal 241 as an output. The input TX signal 219 may be a sequence of digital samples (e.g., a vector). In some embodiments, the input TX signal 219 may include one or more active channels in the frequency domain, but, for simplicity, an input TX signal with only one channel (i.e., a single frequency range of in-band frequencies) is described. In some embodiments, the input TX signal 219 may be a baseband digital signal. The output TX signal 221 may be an analog signal. In some embodiments, the output TX signal 221 may be a TX signal upconverted to RF and amplified by a power amplifier (PA) of the transmitter 220. The input RX signal 261 may also be an analog signal, e.g., a RX signal in RF, to be received by a low-noise amplifier (LNA) of the receiver 240. The output RX signal 241 may be a sequence of digital samples (e.g., a vector). In some embodiments, the output RX signal 241 may be a baseband digital signal.

The communication system 200 may be an FDD transceiver, in which case the antenna 270 may be configured for concurrent reception and transmission of wireless RF signals in separate, i.e., non-overlapping and non-continuous, bands of frequencies, e.g. in bands having a separation of, for example, several MHz from one another. In various embodiments, the antenna 270 may be a single wideband antenna (i.e., a single antenna that may be configured to receive/transmit wideband signals that may include a plurality of RX/TX signal components in different bands) or a plurality of band-specific antennas (i.e., a plurality of antennas each configured to receive and transmit signals in a specific band of frequencies). In some embodiments, an output of the antenna 270 may be coupled to one of the inputs of a multi-band duplexer 260. The duplexer 260 is an electromagnetic component configured for filtering multiple signals to allow for bidirectional communication over a single path between the duplexer 260 and the antenna 270. To that end, the duplexer 260 may be configured for providing RX signals to the receiver 240 and for receiving TX signals from the transmitter 220 (e.g., the output of the transmitter 220 may be coupled to another one of the inputs of the duplexer 260).

Figure 3:
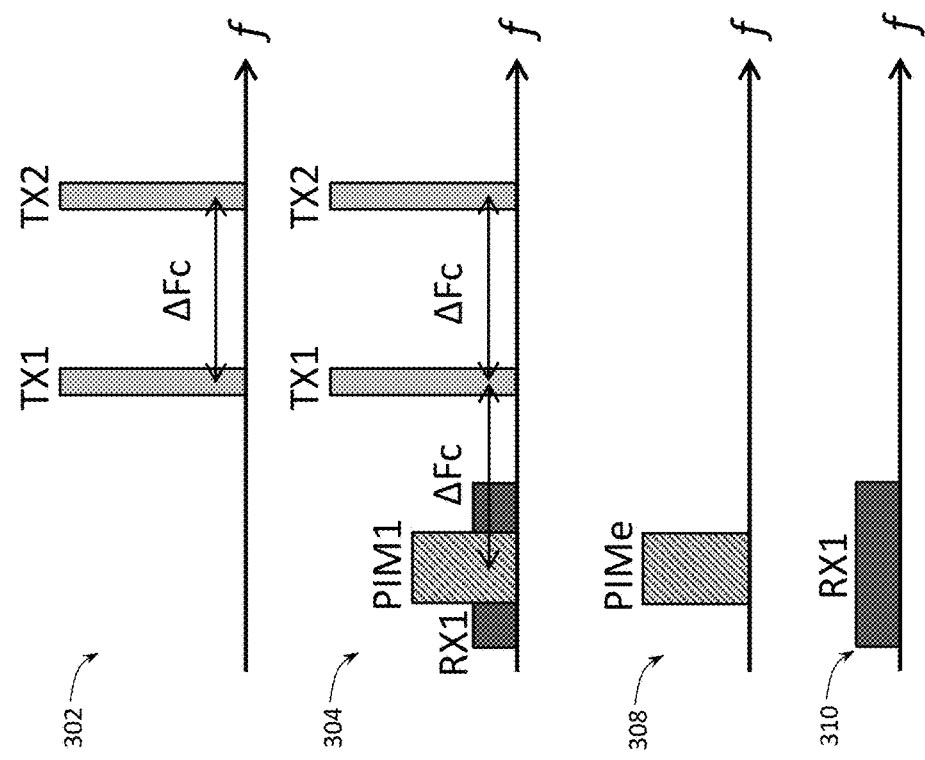
FIG. 3 illustrates a schematic frequency domain representation of steps for performing PIM reduction using a conventional PIM reduction circuit.

The duplexer 260 may be one of the passive devices that contribute to PIM interference in the RX signals received by the receiver 240. The PIM reduction circuit 210 may be used to reduce PIM interference. As shown in FIG. 2, the PIM reduction circuit 210 may include a PIM estimation circuit 212 and a combiner 202. The PIM estimation circuit 212 may use an adaptive model to implement a filter that, when applied to the RX signal (e.g., a RX signal 241 output by the receiver 240), may reduce or eliminate at least some of the PIM interference in the RX signal 241. To that end, the PIM estimation circuit 212 may be configured to receive an RX signal 243 (e.g., the RX signal 243 may be the same as the RX signal 241, or may be a signal indicative of the RX signal 241), and a TX signal 217 (e.g., the TX signal 217 may be the same as the TX signal 219, or may be a signal indicative of the TX signal 219). The TX signal 217 may be indicative of at least two TX carrier signal components, shown in a frequency spectrum illustration (i.e., the x-axis of all frequency spectrum illustrations described herein refers to frequencies, f) 302 of FIG. 3 as a first TX carrier signal component TX1 and a second TX carrier signal component TX2. As shown in the illustration 302, the first and second carrier signal components TX1 and TX2 may have a frequency spacing of $\Delta Fc$ in the TX signal. The frequency spacing $\Delta Fc$ may be a frequency range between TX1 and TX2 when these signals are upconverted to the RF and are wirelessly transmitted by the antenna 270, but the TX signal 217 would be indicative of this spacing as it would be indicative of the first and second carrier signal components TX1 and TX2. The PIM estimation circuit 212 may then be configured to align the TX carrier signal components obtained from the TX signal 217 with signal components obtained from the RX signal 243, namely, with an RX carrier signal component RX1 and with a PIM signal component PIM1, as shown in a frequency spectrum illustration 304 of FIG. 3. As can be seen from the illustrations 302 and 304, shown in FIG. 3, if the first and second TX carrier signal components have a frequency spacing of $\Delta Fc$ in the TX signal (i.e., the illustration 302), then they may be aligned with the RX carrier signal component RX1 so that the frequency spacing between RX1 and the closest one (in frequency) of TX1 and TX2 (which is TX1 for the example shown in FIG. 3) is also $\Delta Fc$. The PIM signal component PIM1 would typically be substantially centered with the RX1, so the frequency spacing between PIM1 and the closest one of TX1 and TX2 is also $\Delta Fc$. Thus, for the conventional PIM estimation circuit 212, TX1−PIM1=TX2−TX1=$\Delta Fc$. The PIM estimation circuit 212 (e.g., a coefficient generator part of the PIM estimation circuit 212) may then use the signal components RX1, TX1, and TX2 aligned as shown in the frequency spectrum illustration 304 to generate/update PIM model coefficients for the filter that, when applied to the RX signal (e.g., a RX signal 241 output by the receiver 240), may reduce or eliminate at least some of the PIM interference in the RX signal 241. Because the frequency spacing between the signal components RX1, TX1, and TX2 of the frequency spectrum illustration 304 is $\Delta Fc$, the algorithm for estimating the PIM model coefficients (i.e., the coefficient generator part of the PIM estimation circuit 212) has to run at a sampling rate that is at least $2*\Delta Fc$. The PIM estimation circuit 212 (e.g., an actuator part of the PIM estimation circuit 212) may then use the PIM model coefficients to generate an estimate of the PIM signal component PIM1, the estimate shown in a frequency spectrum illustration 306 of FIG. 3 as an estimate PIMe. The actuator part of the PIM estimation circuit 212 also has to run at a sampling rate that is at least $2*\Delta Fc$. The combiner 202 may then apply the estimate PIMe to the RX signal 241 to generate an RX signal 203 with reduced PIM, an example of which is shown in a frequency spectrum illustration 308 of FIG. 3. For example, the combiner 202 may subtract the estimate PIMe from the RX signal 241.

Example Communication System with PIM Reduction Using Frequency Shifting

As explained above, in conventional PIM reduction systems and methods, both the PIM model coefficient generator and PIM actuator have to run at a clock rate that is at least $2*\Delta Fc$. Inventors of the present disclosure realized that this rate may be reduced by implementing PIM reduction with frequency shifting, which may advantageously result in reduced power consumption and more efficient/simpler design. A schematic block diagram of an example communication system 400 (e.g., a transceiver) that employs a PIM reduction circuit 410 with frequency shifting, according to some embodiments of the present disclosure, is shown in FIG. 4.

Figure 4:
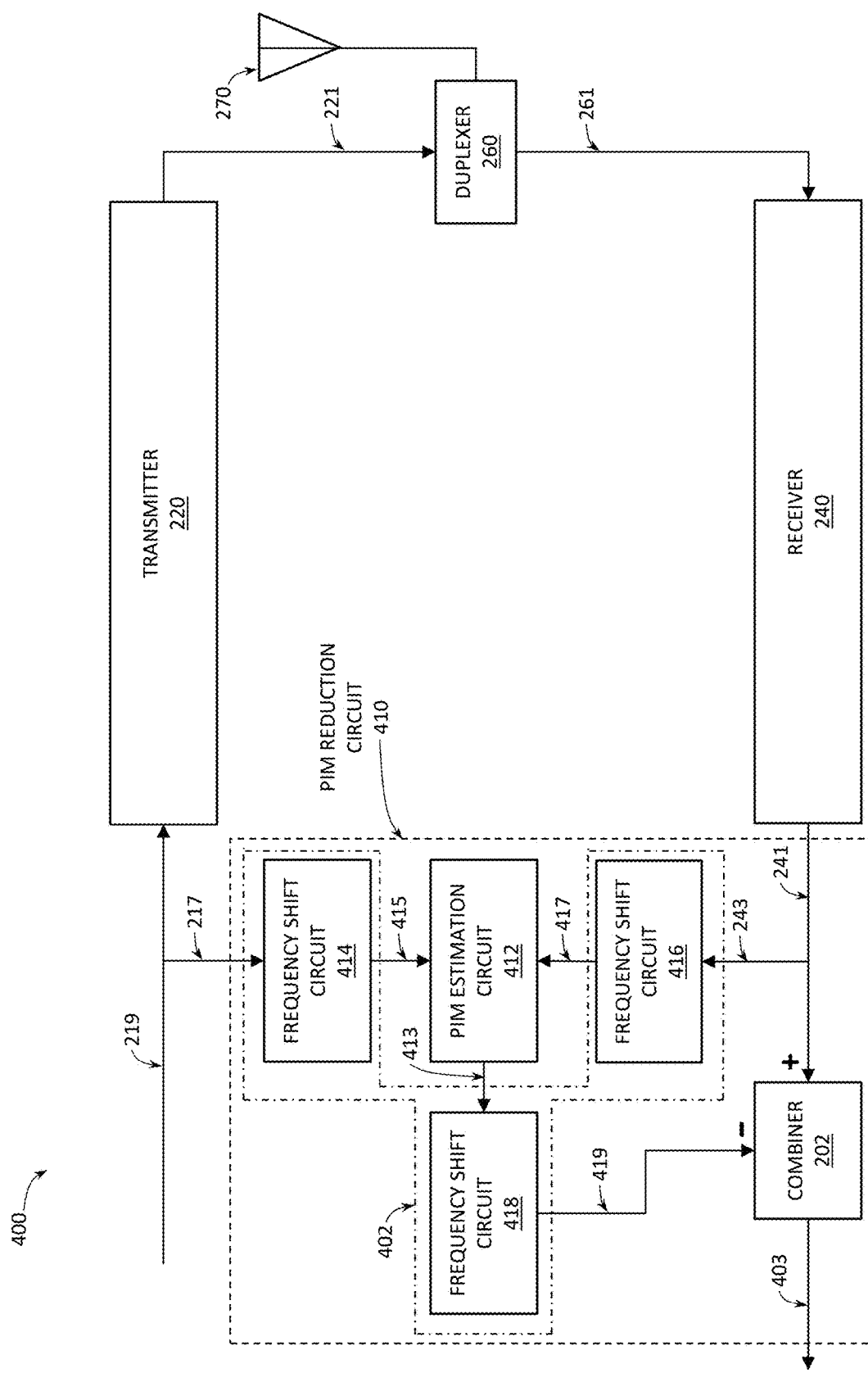
FIG. 4 illustrates a schematic block diagram of a communication system that employs a PIM reduction circuit with frequency shifting, according to some embodiments of the present disclosure.

FIG. 4 illustrates that the communication system 400 may include some components shown in FIG. 2—namely, the transmitter 220, the receiver 240, the duplexer 260, and the antenna 270. Descriptions of these components provided with respect to FIG. 2 is applicable to the communication system 400 of FIG. 4, and, therefore, in the interests of brevity, these descriptions are not repeated here. It should be noted that, in some embodiments, the communication system 400 may not include the duplexer 260 but may have one connection between the transmitter 220 and the antenna 270 and another connection between the antenna 270 and the receiver 240. When the duplexer 260 is included in the communication system 400, the duplexer 260 may be one of the passive devices that causes PIM interference. However, in general, various embodiments of PIM reduction with frequency shifting, presented herein, are applicable to reducing PIM interference caused by any nonlinear passive electronic components or devices (i.e., passive devices/components that may exhibit nonlinear behavior) other than duplexers.

As shown in FIG. 4, the communication system 400 may include a PIM reduction circuit 410. The circuit 410 may include a PIM estimation circuit 412, which may be similar to the PIM estimation circuit 212, and the combiner 202. The PIM estimation circuit 412 can be implemented by any suitable circuits. For instance, in some embodiments, the PIM estimation circuit 412 can be implemented by combinational logic circuits.

In contrast to the conventional communication system shown in FIG. 2, the PIM reduction circuit 410 may further include one or more frequency-shift circuits 414, 416, and 418, thus implementing PIM reduction with frequency shifting. The frequency-shift circuits 414, 416, and 418 are shown in FIG. 4 as separate circuits only for the purposes of describing the different frequency shifting actions applied to different signals. In various embodiments of the PIM reduction circuit 410, the frequency-shift circuits 414, 416, and 418 may be implemented as one or more frequency-shift circuits 402 (shown in FIG. 4 to be enclosed within a dash-dotted contour). The operation of the PIM reduction circuit 410 may be described with reference to the illustrations of FIGS. 5 and 6.

Figure 5:
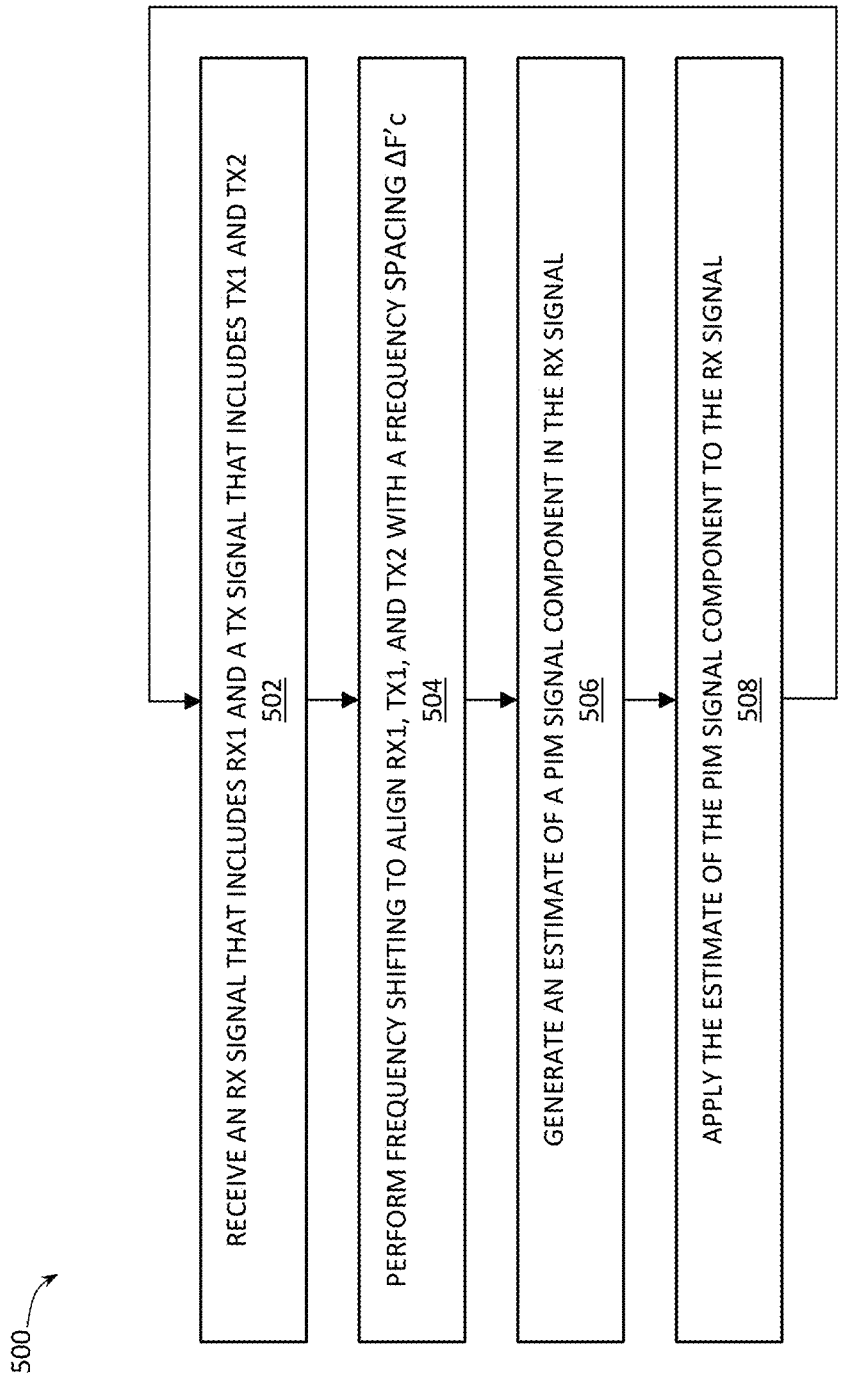
FIG. 5 provides a flow chart of a method for implementing PIM reduction using frequency shifting, according to some embodiments of the present disclosure.
Figure 6:
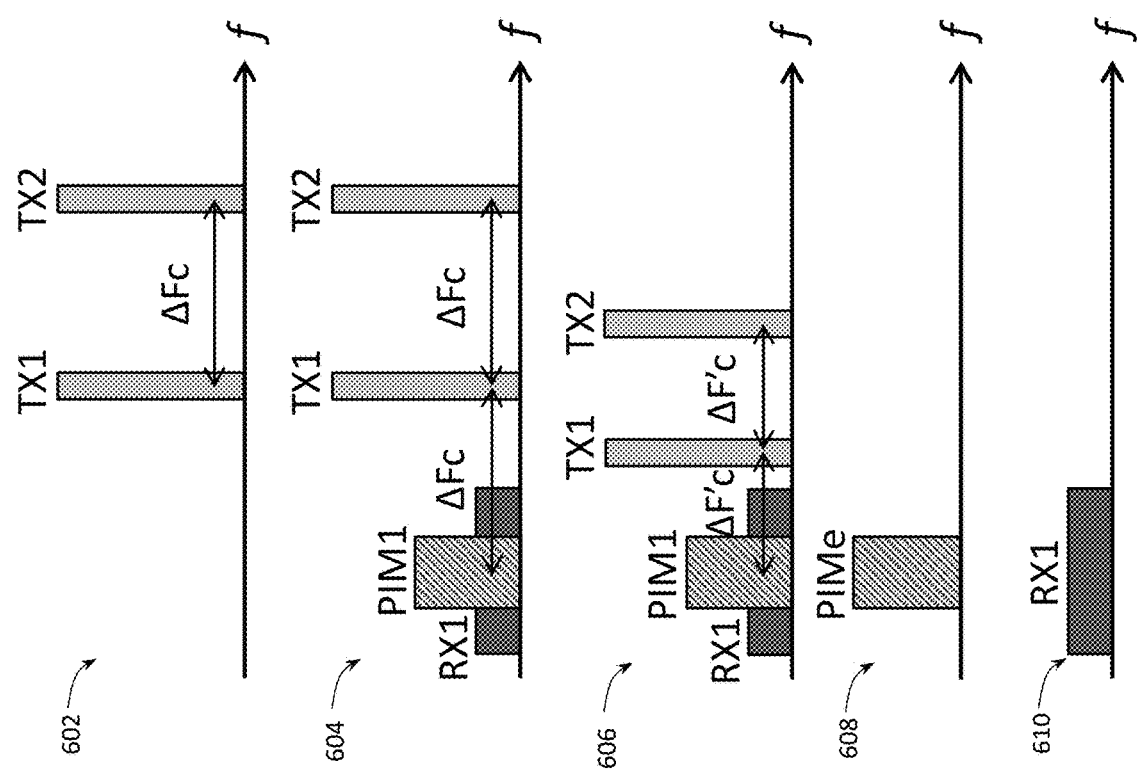
FIG. 6 illustrates a schematic frequency domain representation of steps for performing PIM reduction using a PIM reduction circuit with frequency shifting.

FIG. 5 provides a flow chart of a method 500 for implementing PIM reduction using frequency shifting, according to some embodiments of the present disclosure, while FIG. 6 illustrates a schematic frequency domain representation of steps for performing PIM reduction using the PIM reduction circuit 410. At least portions of the method 500 may be implemented by elements of a communication system according to any embodiments of the present disclosure, e.g., by the communication system described with reference to FIGS. 4 and/or 7, and/or by one or more data processing systems, such as the data processing system 800 shown in FIG. 8. Although described with reference to system components of the systems shown in the present figures, any system, configured to perform operations of the method 500, in any order, is within the scope of the present disclosure.

As shown in FIG. 5, the method 500 may begin with step 502, in which the PIM reduction circuit 410 receives an RX signal that includes (e.g., is indicative of) the RX carrier signal component RX1 and receiving a TX signal that includes (e.g., is indicative of) the first and second TX carrier signal components TX1 and TX2. For example, the RX signal received by the PIM reduction circuit 410 may be the RX signal 243, described above, while the TX signal received by the PIM reduction circuit 410 may be the TX signal 217, described above. A frequency spacing between the first and second TX carrier signal components TX1 and TX2 in the TX signal may be $\Delta Fc$, as shown with a frequency spectrum illustration 602, shown in FIG. 6, and both the TX signal 217 and the RX signal 243 provided to the PIM reduction circuit may be signals having a relatively high sampling rate, at least $2*\Delta Fc$.

The method 500 may then proceed with step 504, in which the one or more frequency-shift circuits 402 may perform frequency shifting of signal components of one or more of the RX signal 243 and the TX signal 217 to generate what may be referred to as a "frequency-shifted output" that includes the PIM signal component of the RX signal and the first and the second TX carrier signal components of the TX signal aligned so that a frequency spacing between the first and the second TX carrier signal components of the TX signal, and a frequency spacing between the PIM signal component of the RX signal and a closest one of the first and the TX second carrier signal components of the TX signal (i.e., TX1 for the example described herein) is $\Delta F'c$, where $\Delta F'c$ is smaller than $\Delta Fc$. A frequency spectrum illustration 604, shown in FIG. 6, illustrates how the components RX1, TX1, and TX2 may be aligned with a frequency spacing $\Delta Fc$, similar to how it was done in conventional PIM reduction systems described above. In contrast to such systems, the PIM reduction circuit 410 is configured to generate the frequency-shifted output that includes components RX1, TX1, and TX2 aligned with a frequency spacing $\Delta F'c$, where $\Delta F'c$ is smaller than $\Delta Fc$, as can be seen in a frequency spectrum illustration 606, shown in FIG. 6. To that end, at least one TX1 and TX2 is frequency-shifted with respect to the other one in order to decrease the frequency spacing between TX1 and TX2 from 6Fc to $\Delta F'c$. In addition, both TX1 and TX2 are aligned with respect to RX1 so that the frequency spacing between RX1 and the one of TX1 and TX2 that is closer, in frequency, to RX1 is also $\Delta F'c$. The frequency shift circuit 414, shown in FIG. 4, may be seen as a circuit configured to implement such frequency shifting of at least one of TX1 and TX2. The frequency shift circuit 416, shown in FIG. 4, may be seen as a circuit configured to implement frequency shifting of RX1 (and, consequently, the PIM signal component PIM1 of the RX signal 217) if RX1 is frequency shifted to be aligned with TX1 and TX2 so that TX1−PIM1=TX2−TX1=$\Delta F'c$. If, on the other hand, TX1 and TX2 are frequency shifted to align TX1 and TX2 with RX1, then the frequency shift circuit 414 may be the circuit configured to implement such frequency shifting. The frequency spectrum illustration 606, shown in FIG. 6, illustrates an example of the frequency-shifted output generated in step 504. It should be noted that while the frequency spectrum illustrations shown in FIG. 6 illustrate the frequency spacings $\Delta Fc$ and $\Delta F'c$ as center-to-center ranges (i.e., a given frequency spacing between two signals of certain bandwidths is measured as a frequency range between center frequencies of the two bandwidths), in other embodiments the frequency spacings $\Delta Fc$ and $\Delta F'c$ may be defined in any other manner, e.g., center-to-edge, edge-to-edge, etc.

With the frequency shifting of step 504, exactly how much smaller can $\Delta F'c$ be compared to $\Delta Fc$ may be dependent on the deployment scenario. For example, consider that TX1 and TX2 are originally at 60 MHz spacing (i.e., $\Delta Fc$=60 MHz), the spacing measured as center-to-center frequency range, and each has a bandwidth of 5 MHz. In such an example, it is possible to reduce the frequency spacing between TX1 and TX2 to as small as 10 MHz (i.e., $\Delta F'c$=10 MHz), again, measured as center-to-center range, which would be 6 times smaller than the original spacing of 60 MHz.

In general, the minimum spacing, $\Delta F'c_{min}$, may be computed based on the signal bandwidth ($BW_S$) and the PIM bandwidth ($BW_{PIM}$) as follows:

$$\Delta F'c_{min} = \frac{BW_{PIM}}{2} + \frac{BW_S}{2} \tag{1}$$

Furthermore, if PIM is assumed to be a 3rd order distortion (and higher order PIM contributions may be substantially neglected), then $BW_{PIM}$ is 3 times larger than $BW_S$ and equation (1) may be re-written as follows:

$$\Delta F'c_{min} = \frac{3*BW_S}{2} + \frac{BW_S}{2} = 2*BW_S \tag{2}$$

Therefore, for the example above where $BW_S$=5 MHz, $\Delta F'c_{min}$=10 Mhz.

The method 500 may then proceed with step 506 that includes the PIM estimation circuit 412 generating an estimate of the PIM signal component based on the frequency-shifted output 606 generated in step 504. In some embodiments, step 506 may include, first, the PIM estimation circuit 412 (e.g., a coefficient generator part of the PIM estimation circuit 412) using the signal components RX1, TX1, and TX2 aligned as shown in the frequency spectrum illustration 606 to generate/update PIM model coefficients for the filter that, when applied to the RX signal (e.g., a RX signal 241 output by the receiver 240), may reduce or eliminate at least some of the PIM interference in the RX signal 241. Step 506 may further include the PIM estimation circuit 412 (e.g., an actuator part of the PIM estimation circuit 412) using the PIM model coefficients to generate an estimate of the PIM signal component PIM1, the estimate shown in a frequency spectrum illustration 608 of FIG. 6 as an estimate PIMe.

In general, step 506 may include any known techniques for generating an estimate of the PIM signal component based on the signal components RX1, TX1, and TX2, with the difference being that now these components are aligned in the frequency-shifted output 606 generated in step 504 at a smaller spacing, $\Delta F'c$. The smaller spacing may allow the algorithm used to generate/update the PIM model coefficients and/or the actuator used to generate the PIM estimate PIMe to be run at a lower rate, because now the rate may only be equal or greater than $2*\Delta F'c$, which may be smaller than $2*\Delta Fc$ that had to be used in conventional PIM reduction systems described above. Furthermore, because the frequency spacing in the frequency-shifted output 606 generated in step 504 is now smaller, compared to $\Delta Fc$, the sampling rate of the RX and TX signals may, correspondingly, be reduced. Therefore, in some embodiments, the PIM reduction circuit 410 may also include one or more decimation circuits configured to decimate (i.e., reduce the sampling rate of, or downsample) at least one of the RX signal 243 and the TX signal 217 prior to the PIM estimation circuit 410 generating the estimate of the PIM signal component in step 506. Operating on decimated signals and/or using circuits that may run at lower clock rates, as described above, may advantageously allow reducing power consumption and simplifying circuit design.

For example, in some embodiments, the frequency shift circuit 414 may be configured to perform decimation and frequency shifting of the TX signal 217 to generate a decimated and frequency-shifted TX signal 415. Similarly, the frequency shift circuit 416 may be configured to perform decimation and frequency shifting of the RX signal 243 to generate a decimated and frequency-shifted RX signal 417. The PIM estimation circuit 412 may then used the decimated version of the TX signal (i.e., the decimated and frequency-shifted signal 415) and/or the decimated version of the RX signal (i.e., the decimated and frequency-shifted signal 417) to generate the estimate PIMe in step 506. In some embodiments, the PIM reduction circuit 410 may be configured to first perform the decimation operation and then perform the frequency shifting described herein. In other embodiments, the PIM reduction circuit 410 may be configured to first perform the frequency shifting described herein and then perform the decimation operation. Furthermore, in various embodiments, the PIM reduction circuit 410 may be configured to implement any of the following: 1) the TX signal 217 is decimated but the RX signal 243 is not decimated, 2) the RX signal 243 is decimated but the TX signal 217 is not decimated, and 3) both the TX signal 217 and the RX signal 243 are decimated. Any of these embodiments may, in turn, be combined with any embodiments described above with respect to which ones of the components RX1, TX1, and TX2 are frequency-shifted by the one or more frequency-shift circuits 402.

The method 500 may further include step 508, in which the PIM reduction circuit 410 may apply the estimate PIMe generated in step 506 to the RX signal 241 to reduce or eliminate at least some of the PIM interference in the RX signal 241. In some embodiments, step 508 may include the combiner 202 applying the estimate PIMe to the RX signal 241 to generate an RX signal 403 (shown in FIG. 4) with reduced PIM, an example of which is shown in a frequency spectrum illustration 610 of FIG. 6. For example, step 508 may include the combiner 202 subtracting the estimate PIMe from the RX signal 241.

In general, step 508 may include using any known techniques for applying the estimate PIMe, generated in step 506, to reduce PIM interference in the RX signal 241. In the embodiments where the signal component RX1 was frequency-shifted in step 504, then, prior to performing step 508, the PIM reduction circuit 410 may be configured to perform frequency shifting of the component PIMe to reverse that frequency shifting. In the embodiments where the RX signal 243 was decimated, then, prior to performing step 508, the PIM reduction circuit 410 may be configured to perform interpolation (i.e., increase the sampling rate of, or upsample) of a signal that contains the estimate PIMe to reverse that decimation. In this manner, the modeled (i.e., estimate) PIM signal component PIMe may be time and frequency aligned with the PIM interference in the actual RX signal 241 so that the estimate PIM signal component PIMe can be used in step 508 to reduce the PIM interference in the RX signal 241.

After step 508, the method 500 may then proceed with the next iteration, now with the updated model coefficients, as shown in FIG. 5 with an arrow from 508 to 502, i.e., steps 502-508 may be iterated again for new RX and TX signals. This may be the case when the PIM model is an adaptive model, meaning that it is formed in an iterative process by gradually adjusting the filter coefficients based on the comparison between the signal to be transmitted and the signal that has been received.

Figure 7:
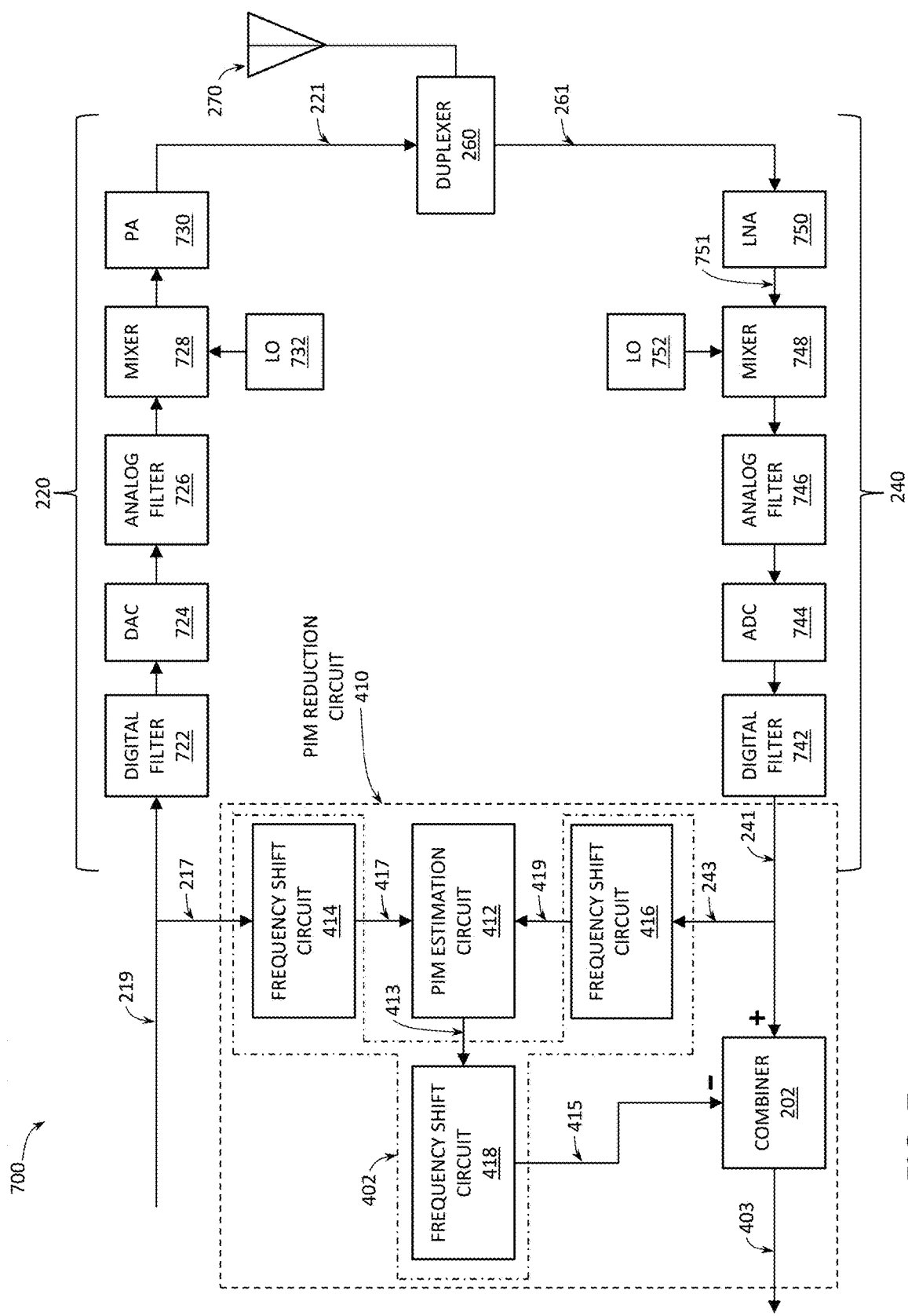
FIG. 7 illustrates a schematic block diagram of a communication system that employs a PIM reduction circuit with frequency shifting and further illustrates example details of the transmitter and the receiver, according to some embodiments of the present disclosure.

FIG. 7 illustrates a schematic block diagram of a communication system (e.g., an RF transceiver) 700 that employs the PIM reduction circuit 410 as described above, and further illustrates example details of the transmitter 220 and the receiver 240, according to some embodiments of the present disclosure. The communication system 700 shown in FIG. 7 is one example implementation of the communication system 400 shown in FIG. 4, where the same reference numerals as described above refer to the same or analogous elements/components so that descriptions provided with respect to one of these figures are assumed to be applicable and do not have to be repeated for the other, and only the differences are described.

As shown in FIG. 7, in some embodiments, the transmitter 220 may include a digital filter 722, a digital-to-analog converter (DAC) 724, an analog filter 726, a mixer 728, a PA 730, and a local oscillator (LO) 732. In such a transmitter, the TX signal 219 may be filtered in the digital domain by the digital filter 722 to generate a filtered input, a digital signal. The output of the digital filter 722 may then be converted to an analog signal by the DAC 724. The analog signal generated by the DAC 724 may then be filtered by the analog filter 726. The output of the analog filter 726 may then be upconverted to RF by the mixer 728, which may receive a signal from the LO 732 to translate the filtered analog signal from the analog filter 726 from baseband to RF. The PA 730, which may be a PA array in some embodiments, may be configured to amplify the RF signal generated by the transmitter 220 (e.g., the RF signal generated by the mixer 728) and provide an amplified RF signal as the TX output signal 221 (which may be a vector). The amplified RF signal 221 can be provided to the antenna 270 to be wirelessly transmitted.

The example of FIG. 7 illustrates the TX signal 217 being based on the TX signal 219 provided to the digital filter 722. However, in other embodiments of the present disclosure, the TX signal 217 that is provided to the PIM reduction circuit 410 may be any other signal in the TX path that includes the transmitter 220, as long as such a signal is indicative of the bandwidths of, and the frequency spacing $\Delta Fc$ between, various TX carrier signal components (e.g., the first and second TX carrier signal components TX1 and TX2) when these signal components are upconverted to the RF and are wirelessly transmitted by the antenna 270. For example, in other embodiments, the TX signal 217 may be a signal based on the output of the digital filter 722, or a signal based on the output of the mixer 728 (converted back to digital domain since the PIM reduction circuit 410 operates on digital signals), etc.

Besides what is shown in FIG. 7, other embodiments of implementing the transmitter 220 are also possible and within the scope of the present disclosure. For instance, in another implementation (not illustrated in the present drawings) the output of the digital filter 722 can be directly converted to an RF signal by the DAC 724. In such an implementation, the RF signal provided by the DAC 724 can then be filtered by the analog filter 726. Since the DAC 724 would directly synthesize the RF signal in this implementation, the mixer 728 and the local oscillator 732 illustrated in FIG. 7 can be omitted from the transmitter circuit 220 in such embodiments.

As further shown in FIG. 7, in some embodiments, the receiver 240 may include a digital filter 742, an analog-to-digital converter (ADC) 744, an analog filter 746, a mixer 748, an LNA 750, and a LO 752. The LNA 750 may receive the RX signal 261 as an input. To that end, an input of the LNA 750 may be coupled to an output port of the antenna 270 (possibly via the duplexer 260). The antenna 270 may receive RF signals in different bands, and the LNA 250 may amplify the received RF signals. Although not specifically shown in FIG. 7, the LNA 750 may be coupled to the harmonic or band-pass filter that may filter received RF signals 761 that have been amplified by the LNA 750 and output by the LNA 750 as RX signals 751. The RX signal 751 may be downconverted to the baseband by the mixer 748, which may receive a signal from the LO 752 (which may be the same or different from the LO 732) to translate the RX signal 751 from the RF to the baseband. The output of the mixer 748 may then be filtered by the analog filter 746. The output of the analog filter 746 may then be converted to a digital signal by the ADC 744. The digital signal generated by the ADC 724 may then be filtered in the digital domain by the digital filter 742 to generate a filtered downconverted signal 241, which may be a sequence of digital values indicative of the RF signal received by the antenna 270, and which may also be modeled as a vector.

The example of FIG. 7 illustrates the RX signal 243 being based on the RX signal 241 provided from the digital filter 742. However, in other embodiments of the present disclosure, the RX signal 243 that is provided to the PIM reduction circuit 410 may be any other signal in the RX path that includes the receiver 240, as long as such a signal is indicative of the bandwidths and the center frequencies of various RX carrier signal components (e.g., the RX carrier signal component RX1) when these signal components are in the RF and are wirelessly received by the antenna 270. For example, in other embodiments, the TX signal 243 may be a signal based on the input to the digital filter 742, or the signal 751 provided to the mixer 748 (converted back to digital domain since the PIM reduction circuit 410 operates on digital signals), etc.

Besides what is shown in FIG. 7, other embodiments of implementing the receiver 240 are also possible and within the scope of the present disclosure. For instance, in another implementation (not illustrated in the present drawings) the RX signal 751 can be directly converted to a baseband signal by the ADC 744. In such an implementation, the downconverted signal provided by the ADC 744 can then be filtered by the digital filter 742. Since the ADC 744 would directly synthesize the baseband signal in this implementation, the mixer 748 and the LO 752 illustrated in FIG. 7 can be omitted from the receiver circuit 240 in such embodiments.

Further variations are possible to the communication system 700 described above. For example, while upconversion and downconversion is described with respect to the baseband frequency, in other embodiments of the communication system 700, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 220 or the receiver 240 may include several such stages of IF conversion. In another example, although a single path mixer is shown in each of the TX path (i.e., the signal path for the signal to be processed by the transmitter 220) and the RX path (i.e., the signal path for the signal to be processed by the receiver 240) of the communication system 700, in some embodiments, the TX path mixer 728 and the RX path mixer 748 may be implemented as a quadrature upconverter and downconverter, respectively, in which case each of them would include a first mixer and a second mixer. For example, for the RX path mixer 748, the first RX path mixer may be configured for performing downconversion to generate an in-phase (I) downconverted RX signal by mixing the RX signal 751 and an in-phase component of the local oscillator signal provided by the local oscillator 752. The second RX path mixer may be configured for performing downconversion to generate a quadrature (Q) downconverted RX signal by mixing the RX signal 751 and a quadrature component of the local oscillator signal provided by the local oscillator 752 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

Furthermore, it should be noted that, while a differentiation is made, both in the illustration of the communication system shown in FIG. 4 and the illustration of the communication system shown in FIG. 7, between the one or more frequency-shifting circuits 402 and the PIM estimation circuit 412, this differentiation may be only functional/logical, to merely differentiate functions that may be performed by a PIM estimation circuit similar to the conventional PIM estimation circuit 212 and functions specifically related to frequency shifting for the PIM reduction techniques described herein. In various embodiments, functionality of any of the one or more frequency-shifting circuits 402, or any decimation or interpolation circuits, may be included, or be considered as a part of the PIM estimation circuit 412, or functionalities of any of these circuits may be spread over a larger number of individual circuits.

Example Data Processing System

Figure 8:
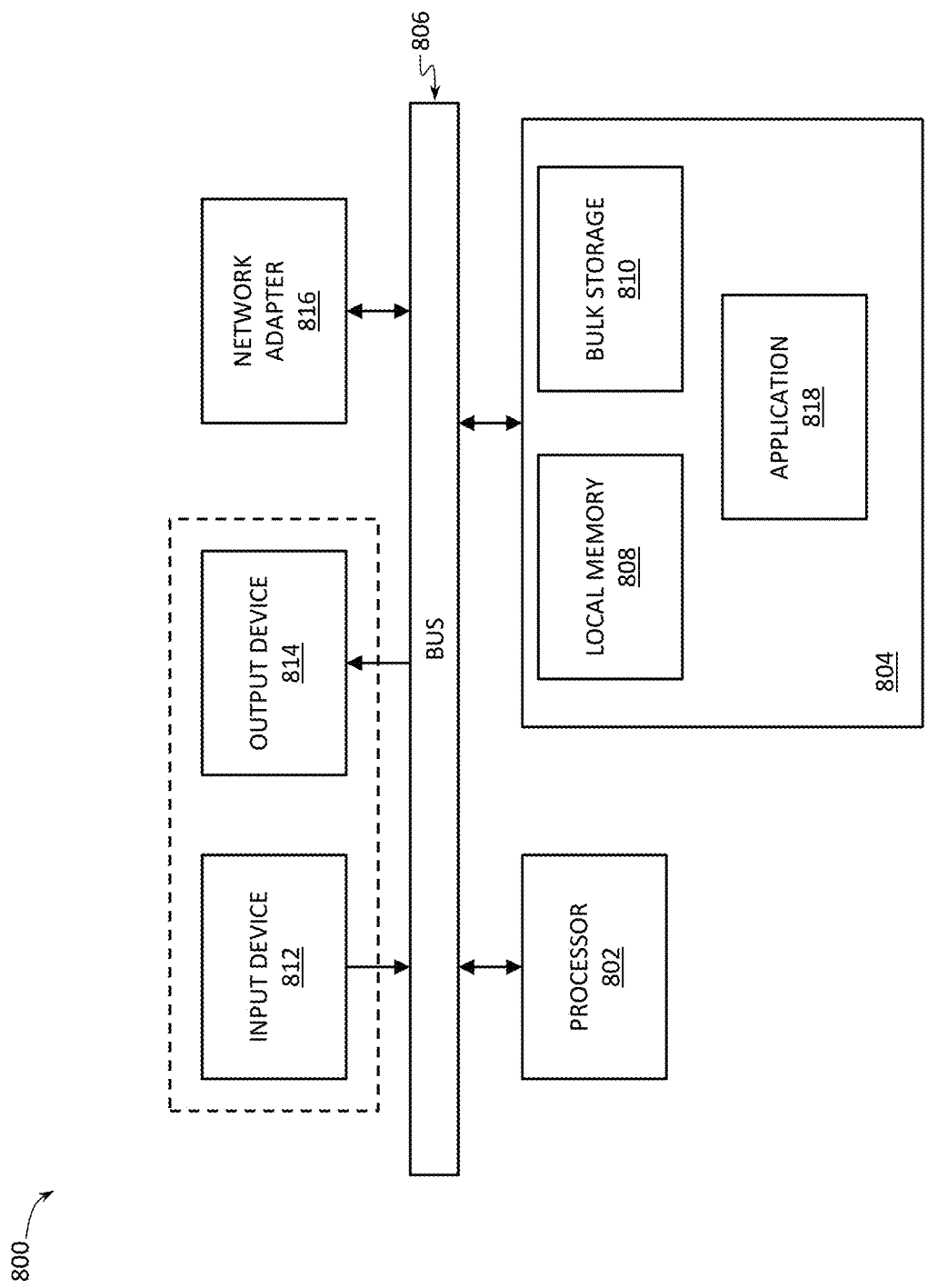
FIG. 8 provides a schematic block diagram of an example data processing system that may be configured to implement at least portions of PIM reduction with frequency shifting, according to some embodiments of the present disclosure.

FIG. 8 provides a schematic block diagram of an example data processing system 800 that may be configured to implement at least portions of PIM reduction with frequency shifting according to the method 500, according to some embodiments of the present disclosure. For example, the data processing system 800 may be used to implement at least portions of the communication system as described with reference to FIGS. 4 and 7, in particular, to implement at least portions of the PIM reduction circuit 410 as described herein.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure.

In some embodiments, the processor 802 can execute software or an algorithm to perform the activities as discussed in this specification, in particular activities related to PIM reduction with frequency shifting, e.g., according to the method 500, such as various techniques implemented by the PIM reduction circuit 410 described herein. The processor 802 may include any combination of hardware, software, or firmware providing programmable logic, including by way of non-limiting example a microprocessor, a digital signal processor (DSP), a field-programmable gate array (FPGA), a programmable logic array (PLA), an integrated circuit (IC), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 4 and 7, can also include suitable interfaces for receiving, transmitting, and/or otherwise communicating data or information in a network environment so that they can communicate with, e.g., the data processing system 800 of another one of these elements.

In certain example implementations, mechanisms for implementing PIM reduction with frequency shifting in communication systems as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 814 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800.

SELECT EXAMPLES

The following paragraphs provide various examples of the embodiments disclosed herein.

Example 1 provides a system for reducing or eliminating PIM interference in an RX signal that includes an RX carrier signal component and a PIM signal component. The system includes one or more frequency-shift circuits, configured to, when a TX signal includes at least a first and a second TX carrier signal components such that, when the first and the second carrier signal components are transmitted by an antenna, a frequency spacing between the first and the second TX carrier signal components is a first value ($\Delta Fc$), perform frequency shifting of signal components of one or more of the RX signal and the TX signal to generate a frequency-shifted output that includes the PIM signal component of the RX signal and the first and the second TX carrier signal components of the TX signal aligned so that a frequency spacing between the first and the second TX carrier signal components of the TX signal, and a frequency spacing between the PIM signal component of the RX signal and a closest one of the first and the TX second carrier signal components of the TX signal is a second value ($\Delta F'c$), where the second value is smaller than the first value. The system further includes a PIM estimation circuit, configured to generate, based on the frequency-shifted output, an estimate of the PIM signal component to be applied to the RX signal to generate an RX signal with reduced PIM.

Example 2 provides the system according to example 1, further including a combiner circuit (e.g., an adder), configured to apply the estimate of the PIM signal component to the RX signal to generate the RX signal with reduced PIM.

Example 3 provides the system according to examples 1 or 2, where applying the estimate includes removing (e.g., subtracting) the estimate of the PIM signal component from the RX signal to generate the RX signal with reduced PIM.

Example 4 provides the system according to any one of the preceding examples, further including one or more decimation circuits, configured to decimate (i.e., reduce the sampling rate of, or downsample) at least one of the RX signal and the TX signal prior to the PIM estimation circuit generating the estimate of the PIM signal component.

Example 5 provides the system according to example 4, where the one or more decimation circuits are configured to decimate the at least one of the RX signal and the TX signal prior to the one or more frequency-shift circuits performing frequency shifting of the signal components of one or more of the RX signal and the TX signal to generate the frequency-shifted output.

Example 6 provides the system according to examples 4 or 5, further including an interpolation circuit, configured to interpolate (i.e., increase the sampling rate of, or upsample) the estimate of the PIM signal component before the estimate of the PIM signal component is applied to the RX signal to generate the RX signal with reduced PIM.

Example 7 provides the system according to any one of the preceding examples, where, if the frequency shifting to generate the frequency-shifted output was performed on the RX signal, the one or more frequency-shift circuits are further configured to perform reverse frequency shifting of the estimate of the PIM signal component before the estimate of the PIM signal component is applied to the RX signal to generate the RX signal with reduced PIM. In this manner, the modeled (i.e., estimate) PIM signal component is phase, amplitude, and frequency aligned with the PIM interference in the actual RX signal so that the estimate PIM signal component can be used to cancel or reduce the PIM interference in the RX signal.

Example 8 provides the system according to any one of the preceding examples, where the second value is at least 2 times smaller than the first value, e.g., at least 4 times smaller or at least 6 times smaller.

Example 9 provides the system according to any one of the preceding examples, where, when the frequency shifting is performed to generate the frequency-shifted output, the PIM signal component and the RX carrier signal component are not frequency-shifted with respect to one another (i.e., in the frequency-shifted output, the PIM signal component of the RX signal and the RX carrier signal component are not frequency-shifted with respect to one another).

Example 10 provides the system according to any one of the preceding examples, where generating the estimate of the PIM signal component includes generating filter coefficients for a filter configured to be applied to the RX signal to reduce the PIM signal component in the RX signal.

Example 11 provides the system according to example 10, where the filter coefficients are generated in an iterative manner.

Example 12 provides a system for reducing or eliminating PIM. The system includes one or more frequency-shift circuits, configured to receive an RX signal that includes an RX carrier signal component, receive a TX signal that includes at least a first and a second TX carrier signal components, where a frequency spacing between the first and the second TX carrier signal components is a first value ($\Delta Fc$), and generate a frequency-shifted output that includes the RX carrier signal component, the first TX carrier signal component, and the second TX carrier signal component aligned in a frequency spectrum so that a frequency spacing between the first and the second TX carrier signal components and a frequency spacing between the RX carrier signal component and a closest one of the first and the TX second carrier signal components is a second value ($\Delta F'c$), where the second value is smaller than the first value. The system further includes a PIM estimation circuit, configured to generate, based on the frequency-shifted output, an estimate of a PIM signal component to be applied to the RX signal to generate an RX signal with reduced PIM.

Example 13 provides the system according to example 12, further including a combiner circuit (e.g., an adder), configured to apply the estimate of the PIM signal component to the RX signal to generate the RX signal with reduced PIM.

Example 14 provides the system according to examples 12 or 13, where applying the estimate includes removing (e.g., subtracting) the estimate of the PIM signal component from the RX signal to generate the RX signal with reduced PIM.

Example 15 provides the system according to any one of examples 12-14, further including one or more decimation circuits, configured to decimate (i.e., reduce the sampling rate of, or downsample) at least one of the RX signal and the TX signal prior to the PIM estimation circuit generating the estimate of the PIM signal component.

Example 16 provides the system according to example 15, further including an interpolation circuit, configured to interpolate (i.e., increase the sampling rate of, or upsample) the estimate of the PIM signal component before the estimate of the PIM signal component is applied to the RX signal to generate the RX signal with reduced PIM.

Example 17 provides the system according to any one of examples 12-16, where, if the RX carrier signal component was frequency-shifted to generate the frequency-shifted output, then the one or more frequency-shift circuits are further configured to perform apply a reverse frequency shifting to the estimate of the PIM signal component before the estimate of the PIM signal component is applied to the RX signal to generate the RX signal with reduced PIM. In this manner, the modeled (i.e., estimate) PIM signal component is phase, amplitude and frequency aligned with the PIM interference in the actual RX signal so that the estimate PIM signal component can be used to reduce or eliminate the PIM interference in the RX signal.

Example 18 provides the system according to any one of the preceding examples, where at least a portion of generating the estimate of the PIM signal component based on the frequency-shifted output is configured to be performed at a clock rate that is smaller than a double of the frequency spacing between the first and the second TX carrier signal components in the TX signal. For example, in some embodiments, the algorithm for estimating the PIM model coefficients may run at a clock rate that is smaller than a double of the frequency spacing between the first and the second TX carrier signal components in the TX signal. In another example, in some embodiments, an actuator configured to generate the estimate of the PIM signal component in the RX signal based on the PIM model coefficients may run at a clock rate that is smaller than a double of the frequency spacing between the first and the second TX carrier signal components in the TX signal.

Example 19 provides the system according to any one of the preceding examples, where the system is an RF transceiver, e.g., an RF transceiver for a base station.

Example 20 provides a computer-implemented method for reducing or eliminating PIM interference in an RX signal. The RX signal includes an RX carrier signal component and a PIM signal component. The RX signal is indicative of a TX signal, where the TX signal includes at least a first and a second TX carrier signal components such that, when the first and the second carrier signal components are transmitted by an antenna, a frequency spacing between the first and the second TX carrier signal components is a first value ($\Delta Fc$). The method includes performing frequency shifting of signal components of one or more of the RX signal and the TX signal to generate a frequency-shifted output that includes the RX carrier signal component of the RX signal and the first and the second TX carrier signal components of the TX signal aligned so that a frequency spacing between the first and the second TX carrier signal components of the TX signal, and a frequency spacing between the RX carrier signal component of the RX signal and a closest one of the first and the TX second carrier signal components of the TX signal is a second value ($\Delta F'c$), where the second value is smaller than the first value. The method further includes generating, based on the frequency-shifted output, an estimate of the PIM signal component to be applied to the RX signal to generate an RX signal with reduced PIM.

Example 21 provides the method according to example 20, where applying the estimate includes removing (e.g., subtracting) the estimate of the PIM signal component from the RX signal.

Example 22 provides the method according to examples 20 or 21, where the method further includes processes for reducing PIM interference in the RX signal by the system according to any one of the preceding examples (e.g., according to any one of examples 1-19).

Example 23 provides a non-transitory computer-readable storage medium including instructions for execution which, when executed by a processor, are operable to perform operations of a method according to any one of the preceding examples (e.g., the method according to any one of examples 20-22), and/or operations to enable a system to reduce PIM interference in the RX signal according to any one of the preceding examples (e.g., according to any one of examples 1-19). Thus, in some examples, the non-transitory computer-readable storage medium according to example 23 may further include instructions operable to perform operations performed by any parts of the system in accordance with any one of the preceding examples.

Variations and Implementations

While embodiments of the present disclosure were described above with references to exemplary implementations as shown in FIGS. 4-8, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as filters, converters, mixers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to PIM reduction with frequency shifting in various communication systems.

Parts of various systems for implementing PIM reduction with frequency shifting as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the communication system shown in FIGS. 4 and 7) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to PIM reduction with frequency shifting as proposed herein illustrate only some of the possible functions that may be executed by, or within, communication systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A system for reducing passive inter-modulation (PIM) in a received signal (RX signal) that includes an RX carrier signal component and a PIM signal component, the system comprising:
  one or more frequency-shift circuits, configured to, when a signal to be transmitted (TX signal) includes at least a first and a second TX carrier signal components such that a frequency spacing between the first and the second TX carrier signal components is a first value, perform frequency shifting of signals components one or more of the RX signal and the TX signal to generate a frequency-shifted output that includes the PIM signal component and the first and the second TX carrier signal components aligned so that a frequency spacing between the first and the second TX carrier signal components, and a frequency spacing between the PIM signal component and a closest one of the first and the TX second carrier signal components is a second value, where the second value is smaller than the first value; and
  a PIM estimation circuit, configured to generate, based on the frequency-shifted output, an estimate of the PIM signal component to be applied to the RX signal to generate an RX signal with reduced PIM.

2. The system according to claim 1, further comprising a combiner circuit, configured to apply the estimate of the PIM signal component to the RX signal to generate the RX signal with reduced PIM.

3. The system according to claim 1, wherein applying the estimate includes removing the estimate of the PIM signal component from the RX signal to generate the RX signal with reduced PIM.

4. The system according to claim 1, further comprising one or more decimation circuits, configured to decimate at least one of the RX signal and the TX signal prior to the PIM estimation circuit generating the estimate of the PIM signal component.

5. The system according to claim 4, wherein the one or more decimation circuits are configured to decimate the at least one of the RX signal and the TX signal prior to the one or more frequency-shift circuits performing frequency shifting of one or more of the RX signal and the TX signal to generate the frequency-shifted output.

6. The system according to claim 4, further comprising an interpolation circuit, configured to interpolate the estimate of the PIM signal component before the estimate of the PIM signal component is applied to the RX signal to generate the RX signal with reduced PIM.

7. The system according to claim 1, wherein, if the frequency shifting to generate the frequency-shifted output was performed on the RX signal, the one or more frequency-shift circuits are further configured to perform reverse frequency shifting of the estimate of the PIM signal component before the estimate of the PIM signal component is applied to the RX signal to generate the RX signal with reduced PIM.

8. The system according to claim 1, wherein the second value is at least 2 times smaller than the first value.

9. The system according to claim 1, wherein, when the frequency shifting is performed to generate the frequency-shifted output, the PIM signal component and the RX carrier signal component are not frequency-shifted with respect to one another.

10. The system according to claim 1, wherein generating the estimate of the PIM signal component includes generating filter coefficients for a filter configured to be applied to the RX signal to reduce the PIM signal component in the RX signal.

11. The system according to claim 10, wherein the filter coefficients are generated in an iterative manner.

12. A system for reducing passive inter-modulation (PIM), the system comprising:
one or more frequency-shift circuits, configured to:
receive a received signal (RX signal) that includes an RX carrier signal component,
receive a signal to be transmitted (TX signal) that includes at least a first and a second TX carrier signal components, where a frequency spacing between the first and the second TX carrier signal components is a first value, and
generate a frequency-shifted output that includes the RX carrier signal component, the first TX carrier signal component, and the second TX carrier signal component aligned in a frequency spectrum so that a frequency spacing between the first and the second TX carrier signal components and a frequency spacing between the RX carrier signal component and a closest one of the first and the TX second carrier signal components is a second value, where the second value is smaller than the first value; and
a PIM estimation circuit, configured to generate, based on the frequency-shifted output, an estimate of a PIM signal component to be applied to the RX signal to generate an RX signal with reduced PIM.

13. The system according to claim 12, further comprising a combiner circuit, configured to apply the estimate of the PIM signal component to the RX signal to generate the RX signal with reduced PIM.

14. The system according to claim 12, wherein applying the estimate includes removing the estimate of the PIM signal component from the RX signal to generate the RX signal with reduced PIM.

15. The system according to claim 12, further comprising one or more decimation circuits, configured to decimate at least one of the RX signal and the TX signal prior to the PIM estimation circuit generating the estimate of the PIM signal component.

16. The system according to claim 15, further comprising an interpolation circuit, configured to interpolate the estimate of the PIM signal component before the estimate of the PIM signal component is applied to the RX signal to generate the RX signal with reduced PIM.

17. The system according to claim 12, wherein, if the RX carrier signal component was frequency-shifted to generate the frequency-shifted output, then the one or more frequency-shift circuits are further configured to perform apply a reverse frequency shifting to the estimate of the PIM signal component before the estimate of the PIM signal component is applied to the RX signal to generate the RX signal with reduced PIM.

18. The system according to claim 12, wherein at least a portion of generating the estimate of the PIM signal component based on the frequency-shifted output is configured to be performed at a clock rate that is smaller than a double of the frequency spacing between the first and the second TX carrier signal components in the TX signal.

19. A computer-implemented method for reducing passive inter-modulation (PIM) in a received signal (RX signal) that includes an RX carrier signal component and a PIM signal component, the method comprising:
when a signal to be transmitted (TX signal) includes at least a first and a second TX carrier signal components such that a frequency spacing between the first and the second TX carrier signal components is a first value, performing frequency shifting of portions one or more of the RX signal and the TX signal to generate a frequency-shifted output that includes the RX carrier signal component and the first and the second TX carrier signal components aligned so that a frequency spacing between the first and the second TX carrier signal components, and a frequency spacing between the RX carrier signal component and a closest one of the first and the TX second carrier signal components is a second value, where the second value is smaller than the first value; and
generating, based on the frequency-shifted output, an estimate of the PIM signal component to be applied to the RX signal to generate an RX signal with reduced PIM.

20. The method according to claim 19, wherein applying the estimate includes removing the estimate of the PIM signal component from the RX signal.

* * * * *